United States Patent [19]

Castner

[11] Patent Number: 4,672,510
[45] Date of Patent: Jun. 9, 1987

[54] PACKAGE FOR AN EXPANDABLE REMOTE INTERFACE UNIT

[75] Inventor: Bryan G. Castner, Tucson, Ariz.

[73] Assignee: Burr-Brown Corporation, Tucson, Ariz.

[21] Appl. No.: 662,959

[22] Filed: Oct. 19, 1984

[51] Int. Cl.$^4$ .............................................. H05K 7/10
[52] U.S. Cl. .................................... 361/415; 361/394; 361/399; 364/708
[58] Field of Search ............... 361/390, 391, 394, 395, 361/399, 415; 364/708

[56] References Cited

U.S. PATENT DOCUMENTS

| | | | |
|---|---|---|---|
| 3,755,716 | 8/1973 | Yoshi et al. | 361/391 X |
| 3,775,643 | 11/1973 | Schachnow | 361/415 X |
| 4,226,491 | 10/1980 | Kazama et al. | 361/399 X |
| 4,303,296 | 12/1981 | Spaulding | 361/415 |
| 4,310,870 | 1/1982 | Kia et al. | 361/394 X |
| 4,388,671 | 6/1983 | Hall et al. | 361/395 X |
| 4,530,066 | 7/1985 | Ohwaki et al. | 361/391 |

Primary Examiner—R. R. Kucia
Attorney, Agent, or Firm—Harry M. Weiss & Associates

[57] ABSTRACT

A housing for a remote interface unit is shown. The housing has a geometry to be appropriate for use with a small data processing system. The housing contains an upper and lower sections that permit convenient assembly and disassembly and, when assembled are securely fastened together with only two coupling units, such as screws. Expansion modules can be coupled to or removed from the unit circuit board without the use of tools, and typically with only one hand.

9 Claims, 5 Drawing Figures

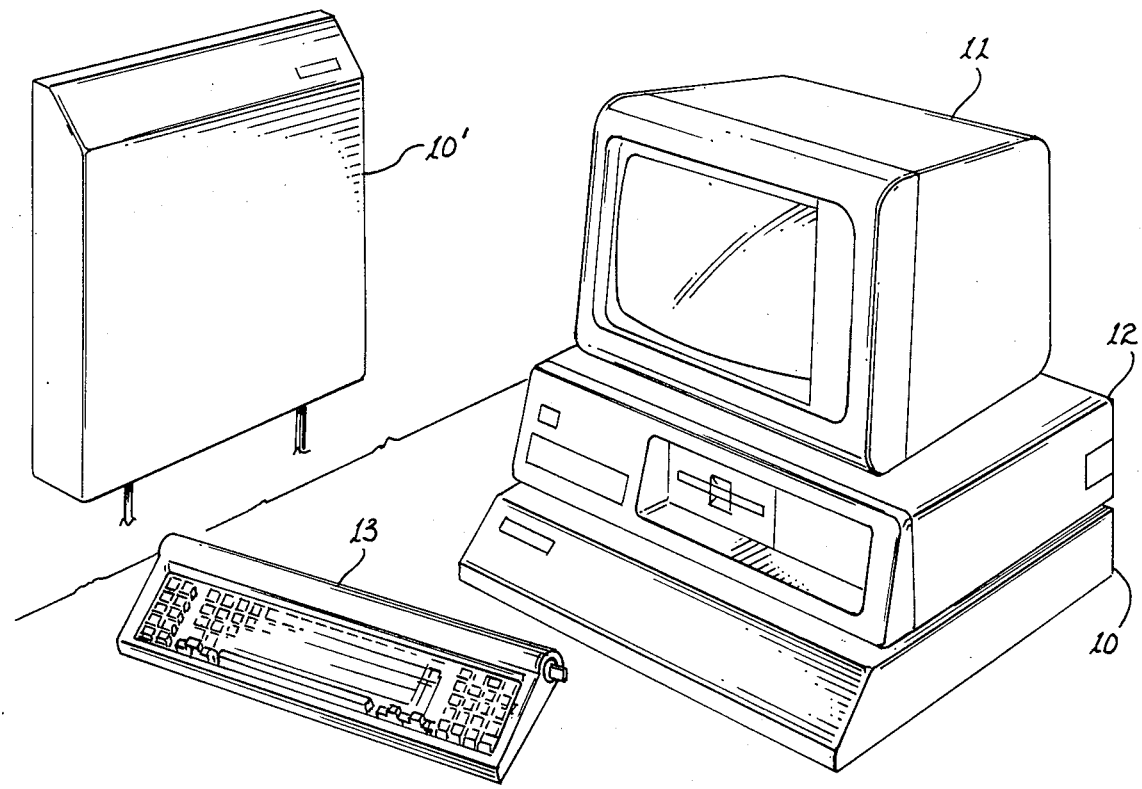
fig. 1
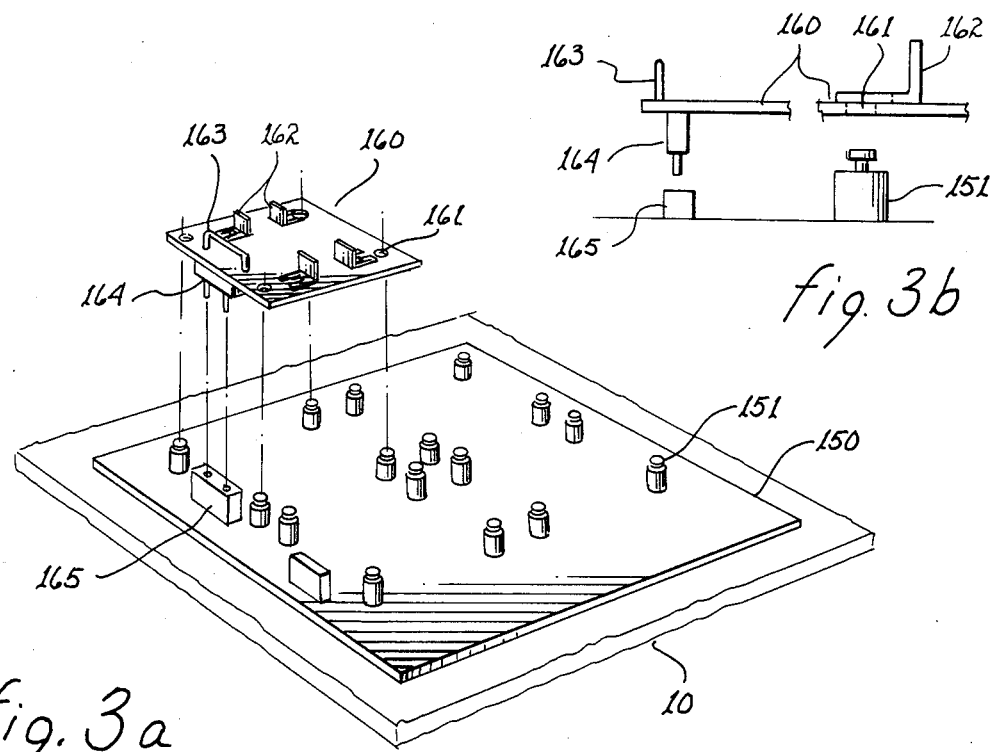
fig. 3b
fig. 3a

PACKAGE FOR AN EXPANDABLE REMOTE INTERFACE UNIT

BACKGROUND OF THE INVENTION

1. Field of the Invention

This invention relates generally to a housing for electronic components and more particularly to a housing for remote interface units.

2. Discussion of the Related Art

Remote interface units provide an electrical interface between a host processing unit and remote devices. Typically, the remote devices control or monitor a process. The remote device supplies status signals, both in digital and in anolog form, and accepts control signals determined by the status signals.

In the related art, the remote interface units provide predetermined functions and have defined operational characteristics. In addition, the location is typically known and so the appearance can be adapted to the expected environment.

The capabilities and physical appearance of the remote interface units have, in the past, been relatively fixed. However, recently small personal computers have been provided with impressive capabilities for data signal manipulation. These data processing systems are being increasingly utilized in process control and monitoring applications. The smaller data processing systems can even be located in the vicinity of the process being controlled or monitored. Furthermore, with the diminishing costs of processing capabilities, many new applications for process control are being developed. The new applications require additional dedicated units with increased flexibility and/or the possibility of progressive expansion of capabilities.

A need has therefore been felt for a remote interface unit that can be located in a variety of environments and has the capability of expansion and/or adjustable signal manipulation characteristics. The requirements for the housing of a requisite unit include an appearance suitable for a plurality of environments, ease of disassembly and the requirement of easy addition or exchange of portions of the unit. For example, it is desirable to have expansion modules that can be added or replaced without the use of hand tools to minimize accidental damage to the electrical apparatus by the tools.

SUMMARY OF THE INVENTION

It is therefore an object of the present invention to provide a package for a remote interface unit that is suitable in appearance for use in conjunction with a data processing unit.

It is another object of the present invention to provide a housing for a remote interface unit that can be easily and assembled and disassembled, but when assembled, has structural integrity.

It is yet another object of the present invention to provide a housing that can be secured after assembly using only two coupling units.

It is a still further object of the present invention to provide a structure for easy addition, removal and replacement of expansion modules.

It is yet a further object of the present invention to provide a remote interface unit for which expansion modules can be added, replaced or removed without the use of tools.

The aforementioned and other objects are accomplished, according to the present invention, by a housing package having roughly the dimensions and structure to be used as a base structure with a personal data processing unit. The housing package has a base component and a cover component. The two back surfaces of the components provide a positioning mechanism prior to relative motion of two components. The relative motion brings apertures of the two portions in close promimity for coupling by means of screws. The relative motion also secures projections in the top component in apertures in the bottom component. In addition, the relative motion engages fastening elements in the sides of the two components, the fastening elements including a projecting element and a patterned slot element. The package includes a unit circuit board with posts for removably securing module circuit boards to the unit circuit board. The module circuit board has an electrical connector for engaging an electrical connector in the unit circuit board when securing the module circuit board to the unit circuit board, thus providing electrical coupling between the unit circuit board.

These and other features of the invention will be understood upon reading of the following description along with the drawings.

BRIEF DESCRIPTION OF THE DRAWINGS

FIG. 1 illustrates the external appearance of the remote interface unit and some placement locations views.

FIG. 3a illustrates the technique of coupling expansion modules for the remote interface unit.

FIG. 3b illustrates in detail the apparatus for coupling the expansion modules and the unit circuit board.

DESCRIPTION OF THE PREFERRED EMBODIMENT

Detailed Description of the Drawings

Referring to FIG. 1, the general appearance of the remote interface unit exterior is shown. The remote interface unit housing 10 can be incorporated in a personal computer data processing system. The remote interface unit is suitable in size and strength to support the system processor unit 12 of the personal computer. The position of monitor 11 on the top of the system processing unit and the keyboard at a nearby location are illustrated. The remote interface unit 10 can, of course, be positioned on a flat surface at a remote location or, as shown by remote interface unit 10', can be attached to a vertical surface when the application requires that position.

Figure 2:
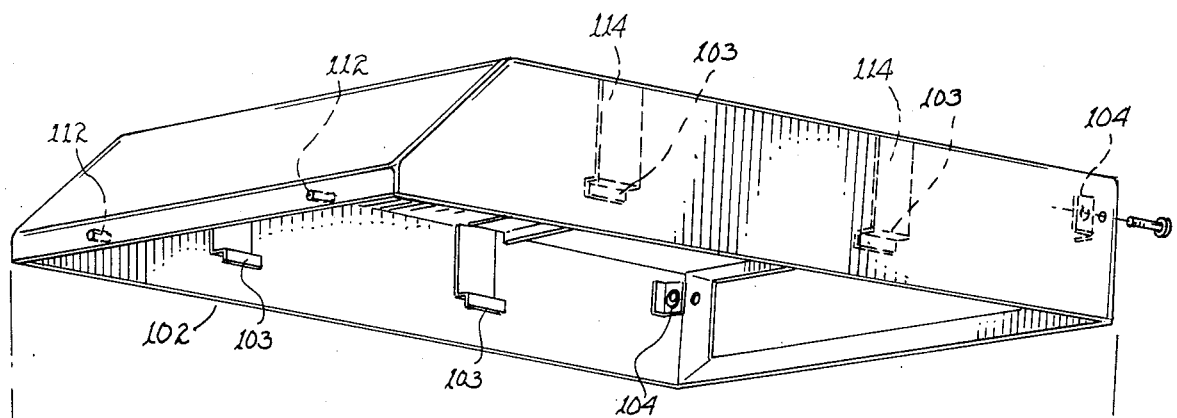
FIG. 2 is an exploded view of the remote interface unit illustrating the method of coupling the base and cover components.

Referring next to FIG. 2, the housing of the remote interface unit is shown. Portion 101 is the base section or component and portion 102 is the cover component or section. The cover section has two inward facing projections 112 in the front surface. Support structures 114 are arranged to provide additional strength and rigidity to the top section. The support structures turn inward and then continue down as shown by coupling members 103. The rear member 111 of cover 102 has a large aperture for permitting access of electrical conductors to the interior of the remote interface unit. Coupled to the top surface and perpendicular to the side surfaces of the cover section are members 104, recessed from the rear of the cover portion. The members 104 can have threaded apertures for receiving screws, bolts or other coupling members. The base section 101 of the remote interface unit has apertures 106 for receiving projections 112. The base portion 101 has cut out portions 105 that includes an opening or slot in the top of the side of base 101. The slot has a pattern that extends parallel to the base. The protruding portion of coupling members 103 is adapted to fit into the top opening and then to slide along the extending slot pattern. The rear plate 110 has apertures 107 for screws and apertures 108 for either admitting electrical conductors into the remote unit or for holding electrical connectors. Though not shown in FIG. 2, the unit circuit board can be coupled to the base portion 101. The unit circuit board can be a metal plate backing for mechanical support and for radiation shielding. With a plate, the unit circuit can be mounted above the floor of base component 101.

Referring next to FIGS. 3a and 3b, apparatus for adding expansion modules 160 to the electronic circuits of the unit circuit board 150 is shown. The expansion module circuit board is coupled to the circuit board 150 by means of a plurality of posts 151. In the preferred embodiment, four posts are available for each expansion module 160. On the unit circuit board is an electrical connector 165 for providing electrical coupling to each expansion module circuit board. On each expansion module circuit board 160 is a handle 163 on the upper surface, an electrical connector 164 on the lower surface and sliding mechanisms 162 associated with an aperture for each post.

Figure 4:
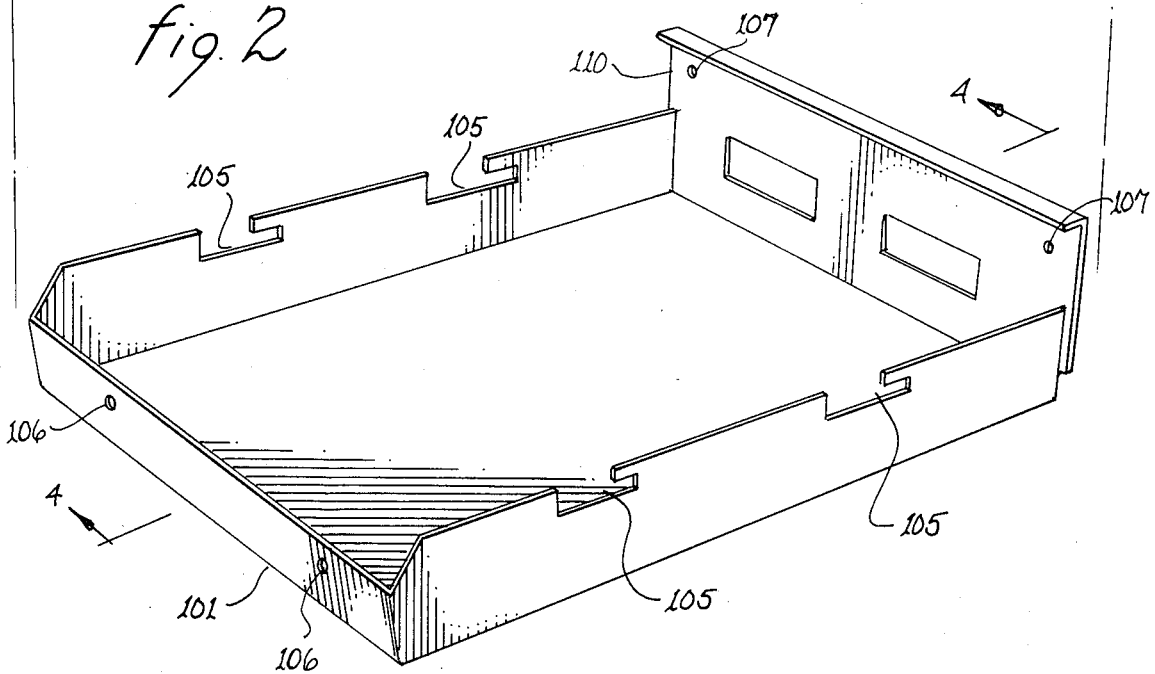
FIG. 4 is a cross-sectional view of the coupled cover and base components of the remote interface unit housing.
Figure 4:
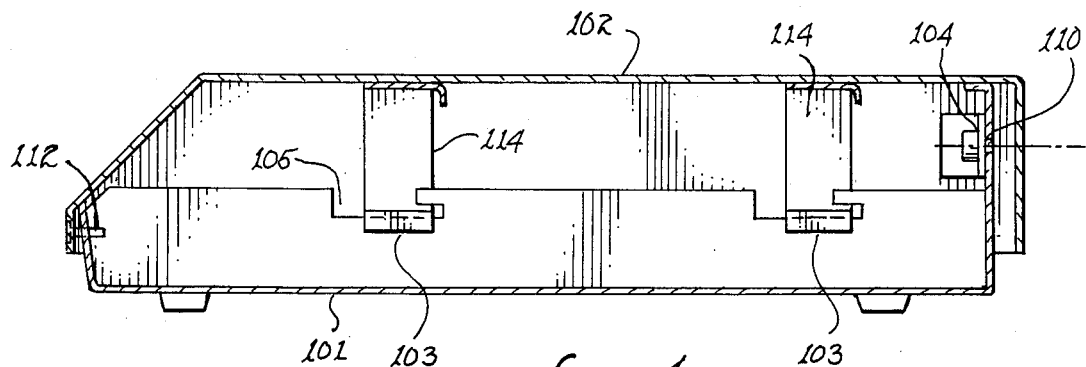

Referring to FIG. 4, a cross-sectional view of the coupled base and cover sections of the remote interface unit housing are shown. Projections 112 are engaged by apertures 106. Coupling elements 103 of support structures 114 engage slots 105 and the coupling member 104 is in contact with back plate 110 and aligned with apperture 107.

Operation of the Preferred Embodiment

The cover 102 and base 101 sections of the remote interface unit housing must be capable of easy assembly and disassembly because the remote interface unit is frequently located in a position inconvenient for extensive manipulation. To assemble the housing, the cover 102 is positioned over the base 101, so that the rear surface 111 of the cover is in contact with the outer surface of the rear surface 110 of the base. In this position, the coupling members 103 are located in the vicinity of the slot openings 107. The cover can be pushed down relative to base 101 until coupling members engage the bottom edge of the openings 107. The cover can then be forced back relative to the base until the coupling members 103 reach the rear edge of openings 107. During this relative motion, projections 112 will be engaged by apertures 106. At the end of travel, the front members of the cover and base of the housing will be either close or in contact, while member 104 will be in close proximity to apertures 107. Apertures 107 and members 104 are positioned so that the threaded portion of the screws can pass through the apertures 107 and engage the threaded portion of member 104. The head of the screw can engage the rear surface 110 of the base. Thus with two screws or other coupling devices, the base and cover portions can be conveniently assembled and securely fastened by a simple procedure. The screws can be of the type operated manually.

To add the expansion module circuit boards 160 to the remote interface unit, the cover of the unit must be removed. Apertures in the expansion module circuit boards, receive the top portion of the posts coupled to the unit circuit board 150. The electrical connectors 165 and 164 will be coupled as the expansion module apertures 161 receive the post members 151. The expansion module must be in the proper orientation, of course, for the two electrical connectors to be coupled. Sliding apparatus 161 is moved outward to engage the posts 151, thereby preventing the expansion module from moving relative to the unit circuit board. To remove the expansion module circuit boards, the sliding apparatus 161 is disengaged from the posts 151. The sliding apparatus is arranged so that the sliding apparatus is released from two posts at once by squeezing the sliding apparatus on the same side of the expansion module, i.e. this removal can be accomplished easily with one hand. After the sliding apparatus 161 has been disengaged from the posts, the handle 163 is grasped and force exerted away from the base to disengage the two connectors without applying undue force or torque to the expansion module board. The electrical coupling terminal for a remote device is positioned on the base portion back surface 110 in apertures 108. The electrical coupling terminals are coupled electrical connectors associated with the expansion module circuit boards. In the preferred embodiment, when the expansion module circuit boards are on the forward portion of the unit circuit board, the unit circuit board is raised (i.e. on posts) and the connecting ribbon cables are passed underneath the unit circuit board. A metal plate can be placed beneath the unit circuit board for strength and for isolation of electrical signals. The unit circuit board includes components for providing a limited interface between a host data processing system and remote devices. The addition of one or more expansion module circuit boards provides increased interface capability, both in number of remote devices and in the manipulative capability to respond to signals from and to apply signals to a remote device.

Once the cover portion of the remote interface unit is removed, than other elements can be replaced in the unit circuit board. For example, the operating system is stored in a read-only-memory unit. The read-only-memory unit can be chosen depending on operational characteristics of the remote interface unit.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A package for housing one or more electrical components of a remote interface unit for coupling a data processing unit and at least one remote device, said package comprising:
   cover means for having (a) a plurality of coupling members, (b) a plurality of projection members, and (c) a plurality of apertures;
   base means for having (a) a plurality of first apertures, each of said plurality of apertures suitable for at least one of said plurality of said projection members of said cover means, (b) a plurality of second apertures, and (c) a slot means adaptable for receiving said plurality of said coupling members of said cover means, wherein said plurality of projection members of said cover means engage said slot means of said base means by motion in a first direction and a motion in a second direction;

a system circuit board means having (a) an electrical coupling means for electrically coupling a data processing system and selected remote devices, (b) an auxiliary board coupling means for operably coupling auxiliary circuit boards having predefined characteristics to said system circuit board; and a base coupling means for coupling said system circuit board to said base.

2. The package for housing electrical components of a remote interface unit of claim 1 further comprising:

at least one auxiliary circuit board means for coupling to said system circuit board means, one of said auxiliary circuit board means having (a) system board coupling means for allowing electrical and mechanical coupling to said system circuit board, and (b) a handling means for facilitating insertion and removal of at least one of said auxiliary circuit board means from said remote interface unit.

3. The package for housing electrical components of a remote interface unit of claim 2 wherein said auxiliary circuit board means can be removed from said system circuit board means manually.

4. A package for housing at least one electrical component of a remote interface unit for coupling a data processing unit and at least one remote device, said package comprising:

cover means for having (a) a plurality of coupling members, and (b) a plurality of projection members;

base means having a plurality of first apertures passing therethrough suitable for accomodating at least one of said plurality of said projection members of said cover means, said base means further having a plurality of second apertures passing therethrough and a slot means for receiving said plurality of said coupling members of said cover means;

a system circuit board means having (a) electrical coupling means for electrically coupling a data processing system, (b) an auxiliary board coupling means for operably coupling auxiliary circuit boards, said auxiliary board coupling means comprises a plurality of posts for coupling of an auxiliary circuit board and an connector for electrical coupling of an auxiliary circuit board, and a base coupling means for coupling said system circuit board to said base.

5. The package for housing electrical components of a remote interface unit of claim 4 further comprising:

at least one auxiliary circuit board means for coupling said system circuit board means, said auxiliary circuit board means having (a) a system board coupling means for operably coupling to said system circuit board, said system board coupling means comprises a plurality of sliding members for coupling to said posts of said auxiliary board coupling means of said system circuit board and an electrical connector for coupling to said auxiliary board coupling means of said system circuit board, and (b) a handling means for facilitating insertion and removal of said auxiliary circuit board from said remote interface unit.

6. The package for housing electrical components of a remote interface unit of claim 5 wherein said auxiliary circuit board means can be removed from said system circuit board means manually.

7. A package for housing at least one electrical component of a remote interface unit for coupling a data processing unit and at least one remote device, said package comprising:

cover means for having (a) a plurality of coupling members and (b) a plurality of projection members;

base means having a plurality of first apertures passing therethrough suitable for accomodating at least one of said plurality of said projection members of said cover means, said base means further having a plurality of second apertures passing therethrough and a slot means for receiving said plurality of said coupling members of said cover means, said plurality of projection members of said cover means engage said slot means of said base means by motion in a first direction and a motion in a second direction;

a system circuit board means having (a) electrical coupling means for electrically coupling a data processing system, (b) an auxiliary board coupling means for operably coupling auxiliary circuit boards, said auxiliary board coupling means comprises a plurality of posts for coupling of an auxiliary circuit board and an connector for electrical coupling of an auxiliary circuit board, and a base coupling means for coupling said system circuit board to said base.

8. The package for housing electrical components of a remote interface unit of claim 7 further comprising:

at least one auxiliary circuit board means for coupling said system circuit board means, said auxiliary circuit board means having (a) a system board coupling means for operably coupling to said system circuit board, said system board coupling means comprises a plurality of sliding members for coupling to said posts of said auxiliary board coupling means of said system circuit borad and an electrical connector for coupling to said auxiliary board coupling means of said system circuit board, and (b) a handling means for facilitating insertion and removal of said auxiliary circuit board from said remote interface unit.

9. The package for housing electrical components of a remote interface unit of claim 8 wherein said auxiliary circuit board means can be removed from said system circuit board means manually.

* * * * *